US012805197B2

(12) United States Patent
Zhou et al.

(10) Patent No.: US 12,805,197 B2
(45) Date of Patent: Nov. 17, 2026

(54) PIEZOELECTRIC VIBRATOR AND PIEZOELECTRIC VIBRATOR ASSEMBLY

(71) Applicant: AAC Microtech (Changzhou) Co., Ltd., Changzhou (CN)

(72) Inventors: Zhuofan Zhou, Changzhou (CN); Wen Zhong, Changzhou (CN); Wenbiao Xu, Changzhou (CN)

(73) Assignee: AAG Microtech (Changzhou) Co., Ltd., Changzhou (CN)

(*) Notice: Subject to any disclaimer, the term of this patent is extended or adjusted under 35 U.S.C. 154(b) by 735 days.

(21) Appl. No.: 18/457,323

(22) Filed: Aug. 28, 2023

(65) Prior Publication Data

US 2024/0244980 A1 Jul. 18, 2024

Related U.S. Application Data

(63) Continuation of application No. PCT/CN2023/083971, filed on Mar. 27, 2023.

(30) Foreign Application Priority Data

Jan. 18, 2023 (CN) ......................... 202310068021.6

(51) Int. Cl.

| | |
|---|---|
| ***H10N 30/20*** | (2023.01) |
| ***H10N 30/50*** | (2023.01) |
| ***H10N 30/87*** | (2023.01) |
| ***H10N 30/88*** | (2023.01) |

(52) U.S. Cl.
CPC ........... *H10N 30/88* (2023.02); *H10N 30/206* (2023.02); *H10N 30/503* (2023.02); *H10N 30/871* (2023.02); *H10N 30/872* (2023.02)

(58) Field of Classification Search
CPC .... H10N 30/88; H10N 30/871; H10N 30/872; H10N 30/206; H10N 30/503
See application file for complete search history.

(56) References Cited

U.S. PATENT DOCUMENTS 6,465,936 B1 * 10/2002 Knowles ................ H02N 2/043
310/328

* cited by examiner

*Primary Examiner* — Emily P Pham
*Assistant Examiner* — Monica Mata
(74) *Attorney, Agent, or Firm* — Wiersch Law Group

(57) ABSTRACT

Provided are a piezoelectric vibrator and a piezoelectric vibrator assembly having a small volume, fast response, and high energy conversion efficiency. The piezoelectric vibrator includes a piezoelectric body and an amplifying unit fixedly supported on at least one of two opposite sides of the piezoelectric body. The piezoelectric body comprises a single-layer or multi-layer material with a piezoelectric effect. The amplifying unit is a flat structure formed by an elastic reinforcing element and having a same shape as the piezoelectric body. The elastic reinforcing element is a metal sheet. The piezoelectric body, when an external voltage is applied, expands or contracts along a first direction parallel to a plane of the piezoelectric body, and simultaneously, the amplifying unit contracts or expands along a second direction. The first direction and the second direction are perpendicular to each other.

26 Claims, 17 Drawing Sheets

A-A

PIEZOELECTRIC VIBRATOR AND PIEZOELECTRIC VIBRATOR ASSEMBLY

TECHNICAL FIELD

The present disclosure relates to a piezoelectric vibrator, and in particular, to a piezoelectric vibrator and a piezoelectric vibrator assembly applied to electronic devices.

BACKGROUND

With the development of electronic devices, a piezoelectric vibrator can realize various applications. A piezoelectric vibrator is used as a piezoelectric motor for tactile feedback and applied to fields such as mobile phones, tablets, notebook computers, vehicles, and stylus pens. The piezoelectric vibrator is further used as a sounding unit of a speaker and applied to basic electronic devices in fields such as sound on display and bone conduction. The piezoelectric vibrator is also used as a pressure sensor to sense an external pressure change and convert the external pressure change into a voltage signal. The piezoelectric vibrator is an important component of the electronic devices.

The piezoelectric motor for tactile feedback, the sounding unit of the speaker, and the pressure sensor in the related art all have structures with respective functions.

However, the piezoelectric motor for tactile feedback, the sounding unit of the speaker, and the pressure sensor in the related art each have a large number of components and occupy a large volume. A controller is required for the components, causing that the components respond slowly and a resonant frequency is fixed and unadjustable.

Therefore, there is a need to provide a new piezoelectric vibrator to solve the above problems.

SUMMARY

The present disclosure provides a piezoelectric vibrator and a piezoelectric vibrator assembly with a small volume, fast response, an adjustable resonance frequency, a wide operating frequency, and high energy conversion efficiency.

In an aspect, a piezoelectric vibrator is provided. The piezoelectric vibrator includes a piezoelectric body and an amplifying unit fixedly supported on at least one of two opposite sides of the piezoelectric body, The piezoelectric body is made of a single-layer or multi-layer material with a piezoelectric effect. The amplifying unit is a flat structure formed by an elastic reinforcing element and having a same shape as the piezoelectric body, the elastic reinforcing element being a metal sheet. The piezoelectric body, when subjected to an external voltage, expands or contracts along a first direction parallel to a plane of the piezoelectric body, and at the same time, the amplifying unit contracts or expands along a second direction, the first direction and the second direction being perpendicular to each other.

As an improvement, the piezoelectric body includes: a plurality of stacked internal electrodes having different polarities; a plurality of stacked piezoelectric layers surrounding peripheries of the plurality of internal electrodes and electrically connected to the plurality of internal electrodes; and a plurality of external electrodes surrounding peripheries of the plurality of piezoelectric layers and electrically connected to the plurality of piezoelectric layers. The plurality of internal electrodes and the plurality of piezoelectric layers are stacked along the second direction, and each of the plurality of piezoelectric layers includes a single piezoelectric ceramic layer or a plurality of piezoelectric ceramic layers.

As an improvement, the piezoelectric body is in a shape of a strip or a square or a circle.

As an improvement, the piezoelectric body includes a plurality of piezoelectric ceramic layers polarized along the first direction.

As an improvement, the amplifying unit includes: a first section fixed to the piezoelectric body; two second sections respectively bending and obliquely extending from two opposite ends of the first section away from the piezoelectric body; two third sections respectively bending and extending from the two second sections in a direction away from the first section and spaced apart from the piezoelectric body; a fourth section spaced apart from and mirror-symmetrical with the first section; two fifth sections respectively extending outward from the fourth section and respectively spaced apart from and mirror-symmetrical with the two second sections; and two sixth sections respectively attached to the two third sections and mirror-symmetrical with each other. Each of the two third sections is attached and fixed to a corresponding sixth section of the two sixth sections and constitutes a thickened end portion of the amplifying unit together with the corresponding sixth section. The thickened end portion is supported on and fixed to the piezoelectric body. The two first sections, the two second sections, the fourth section, and the two fifth sections jointly constitute the flat structure.

As an improvement, a length of the thickened end portion along the first direction is equal to half of a length of the flat structure along the first direction.

As an improvement, the piezoelectric vibrator further includes a fixed end block, the thickened end portion is supported on and connected to the piezoelectric body through the fixed end block, and the fixed end block is electrically insulated from the piezoelectric body.

As an improvement, the amplifying unit includes two amplifying units respectively located on the two opposite sides of the piezoelectric body, and the fixed end block includes at least two fixed end blocks. Each of the two amplifying units is connected to the piezoelectric body through one of the at least two fixed end blocks.

As an improvement, the first section is fixed to a center of the piezoelectric body, and the amplifying unit has a symmetrical structure centered on the first section, and an amplification factor of the piezoelectric vibrator is a ratio of a displacement amount of the piezoelectric body along the first direction to a displacement amount of the amplifying unit along the second direction.

As an improvement, the amplifying unit is in a shape of a rectangle or a square or a circle.

As an improvement, the amplifying unit further includes a fixed portion extending from the thickened end portion and fixed to an edge of the piezoelectric body, and the thickened end portion bends and obliquely extends from the flat structure to the edge of the piezoelectric body.

As an improvement, the amplifying unit includes at least one amplifying unit, one amplifying unit of the at least one amplifying unit is located on one side of the piezoelectric body, and the other side of the piezoelectric body is connected to another amplifying unit of the at least one amplifying unit or a feasible structure configured to buffer amplification.

As an improvement, the amplifying unit further includes a bending portion bending and obliquely extending from the thickened end portion to an edge of the piezoelectric body and a fixed portion fixed to the edge of the piezoelectric body.

As an improvement, the amplifying unit includes at least one amplifying unit, one amplifying unit of the at least one amplifying unit is located on one side of the piezoelectric body, and the other side of the piezoelectric body is connected to another amplifying unit of the at least one amplifying unit or a feasible structure configured to buffer amplification.

As an improvement, the fixed end block includes at least one fixed end block, each fixed end block is fixed to an outer side of the piezoelectric body along the first direction, and the thickened end portions corresponding to the two amplifying units are respectively fixed to two opposite ends of a fixed end block of the at least one fixed end block along the second direction. The piezoelectric vibrator further includes a connecting section made of a same metal as the amplifying unit. The connecting section is fixed to a side of the fixed end block away from the piezoelectric body along the first direction, and the third section of the amplifying unit is connected to the connecting section.

As an improvement, the piezoelectric vibrator further includes two buffer members, the two buffer members each being fixed to a side of the corresponding first section away from the piezoelectric body and arranged apart from the fourth section.

As an improvement, the buffer member is made of a polymer.

As an improvement, the piezoelectric vibrator further includes a connecting section made of a same metal as the amplifying unit. The connecting section is fixed to an outer side of the piezoelectric body along the first direction, and the third sections corresponding to the two amplifying units are respectively connected to the connecting section.

As an improvement, the piezoelectric vibrator further includes two buffer members, the two buffer members each being fixed to a side of the corresponding first section away from the piezoelectric body and arranged apart from the fourth section.

As an improvement, the buffer member is made of a polymer.

As an improvement, the sixth sections corresponding to the two amplifying units respectively extend away from the first section, and two opposite sides of the fixed end block along the second direction are connected extension parts of the two sixth sections.

As an improvement, the piezoelectric vibrator further includes a two buffer members, the two buffer members each being fixed to a side of the corresponding first section away from the piezoelectric body and arranged apart from the fourth section.

As an improvement, the buffer member is made of a polymer.

As an improvement, the amplifying unit includes a first amplifying unit, a second amplifying unit, and a third amplifying unit, and the first, second and third amplifying units being all located on a same side of the piezoelectric body and jointly forming a three-layer elastic element structure. The first amplifying unit and the second amplifying unit are connected side by side, the third section of the first amplifying unit and the third section of the second amplifying unit are made of a same metal sheet. The sixth section of the first amplifying unit and the sixth section of the second amplifying unit are made of a same metal sheet. The third amplifying unit is arranged on a side of the first amplifying unit and the second amplifying unit away from the piezoelectric body. The first section of the third amplifying unit, the sixth section of the first amplifying unit, and the sixth section of the second amplifying unit are all made of a same metal sheet. The two second sections of the third amplifying unit are respectively the fifth sections extending from the connected sixth sections the first amplifying unit and the second amplifying unit. The two third sections of the third amplifying unit are respectively the fourth section of the first amplifying unit and the fourth section of the second amplifying unit. The two sixth sections of the third amplifying unit are fixedly attached to the fourth section of the first amplifying unit and the fourth section of the second amplifying unit respectively.

As an improvement, the amplifying unit comprises two amplifying units respectively located on the two opposite sides of the piezoelectric body.

In another aspect, a piezoelectric vibrator assembly is provided. The piezoelectric vibrator assembly includes at least two piezoelectric vibrators, the two piezoelectric vibrators being fixedly stacked along the second direction; the fourth sections in adjacent amplifying units of the two piezoelectric vibrators being fitted and fixed.

According to the piezoelectric vibrator and the piezoelectric vibrator assembly of the present disclosure, a piezoelectric body is provided, and at least one of two opposite sides of the piezoelectric body is provided with an amplifying unit fixedly supported thereon. The piezoelectric body is made of a single-layer or multi-layer piezoelectric material. When the piezoelectric body is subjected to an external voltage, due to an inverse piezoelectric effect, the piezoelectric body expands or contracts along a first direction parallel to a plane of the piezoelectric body. Since the amplifying unit is a flat structure formed by an elastic reinforcing element and having a same shape as the piezoelectric body and the elastic reinforcing element is a metal sheet, the amplifying unit contracts or expands along the second direction simultaneously. The first direction and the second direction are perpendicular to each other. The structure alleviates the problem of small response displacement or requirement for a high stimulus voltage of the piezoelectric body, so that the piezoelectric vibrator and the piezoelectric vibrator assembly have a small volume, fast response, an adjustable resonance frequency, a wide operating frequency, and high energy conversion efficiency.

DESCRIPTION OF EMBODIMENTS

The present disclosure will be further described below in conjunction with the accompanying drawings and embodiments.

Embodiment 1

Embodiment 1 of the present disclosure provides a piezoelectric vibrator 100.

Figure 1:
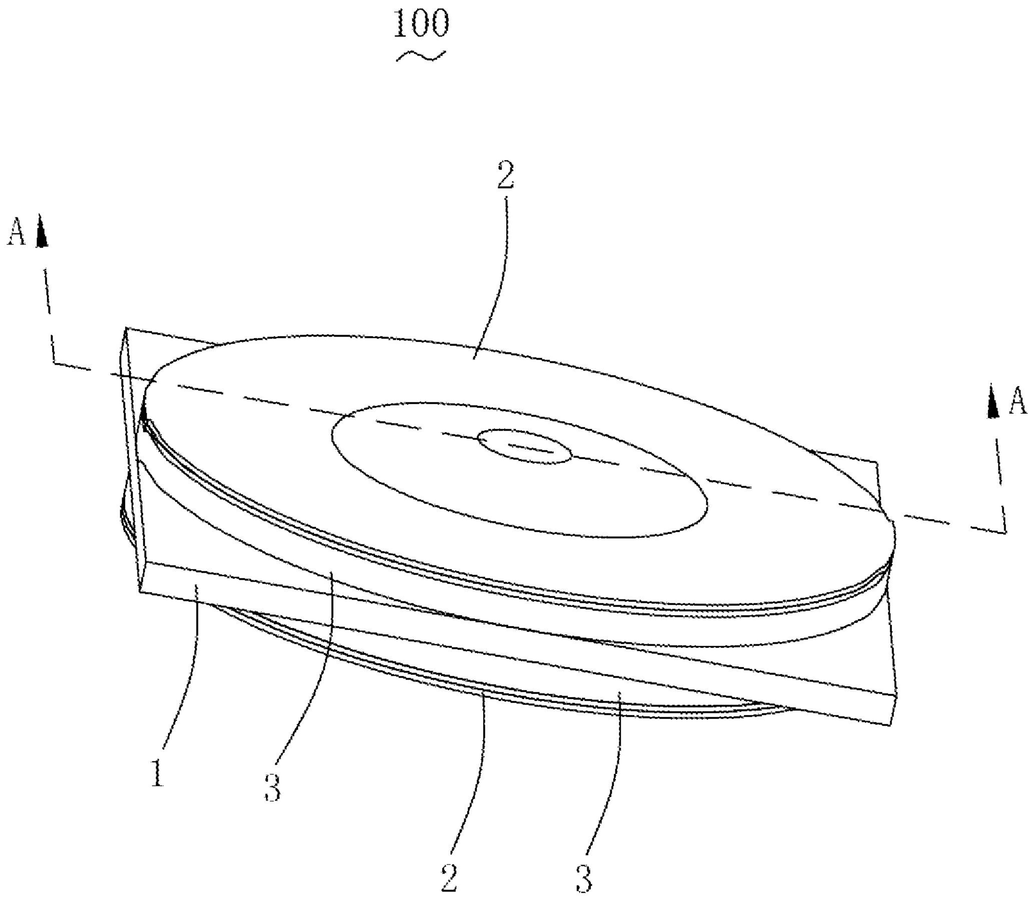
FIG. 1 is a three-dimensional view of a piezoelectric vibrator according to Embodiment 1 of the present disclosure.
Figure 2:
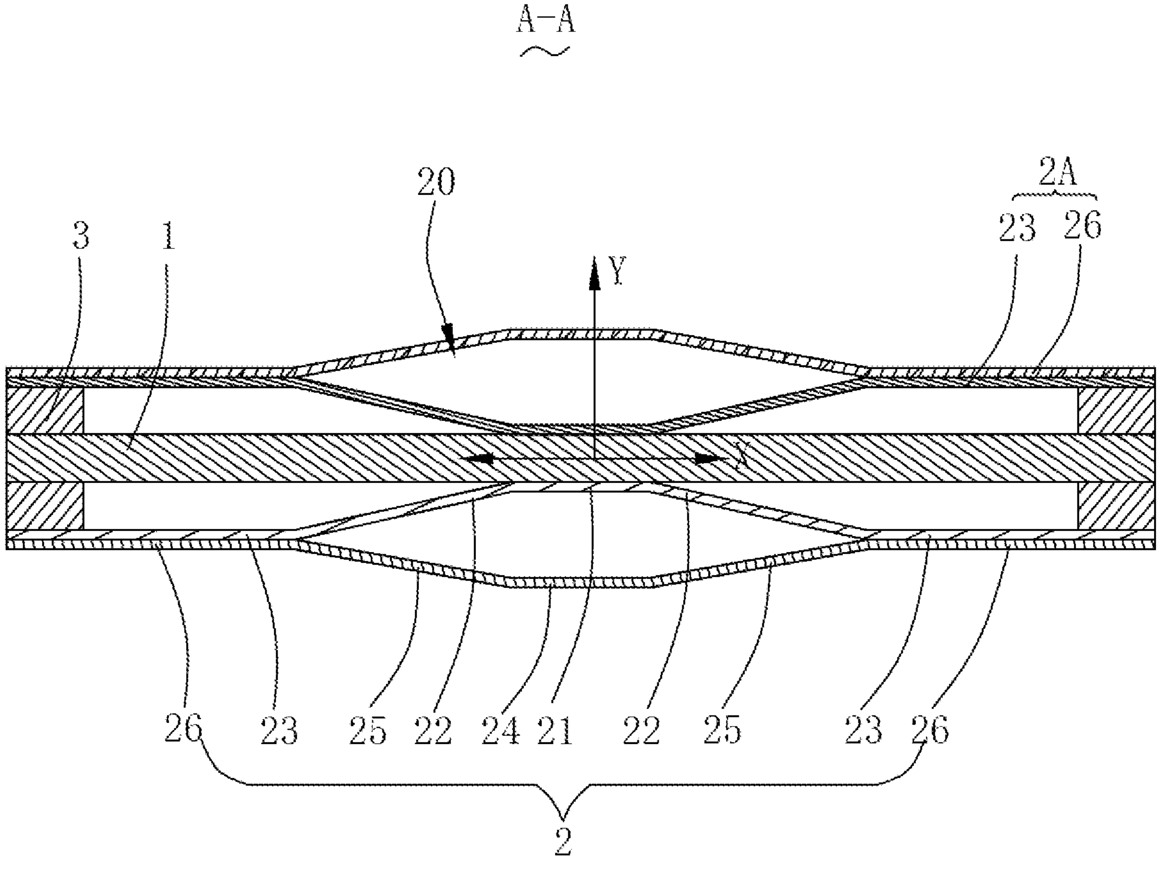
FIG. 2 is a cross-sectional view taken along line A-A in FIG. 1.

Referring to FIG. 1 and FIG. 2, the piezoelectric vibrator 100 includes a piezoelectric body 1 and an amplifying unit 2 supported on and fixed to at least one side of two opposite sides of the piezoelectric body 1. That means one of the two opposite sides of the piezoelectric body 1 is provided with an amplifying unit 2, or two opposite sides of the piezoelectric body 1 each are provided with an amplifying unit 2.

In Embodiment 1, the piezoelectric vibrator 100 further includes a fixed end block 3. The fixed end block 3 is configured to support the amplifying unit 2 and connect the amplifying unit 2 to the piezoelectric body 1.

The piezoelectric body 1 include a single layer piezoelectric material or a multi-layer piezoelectric material. The piezoelectric material has a piezoelectric effect.

Figure 3:
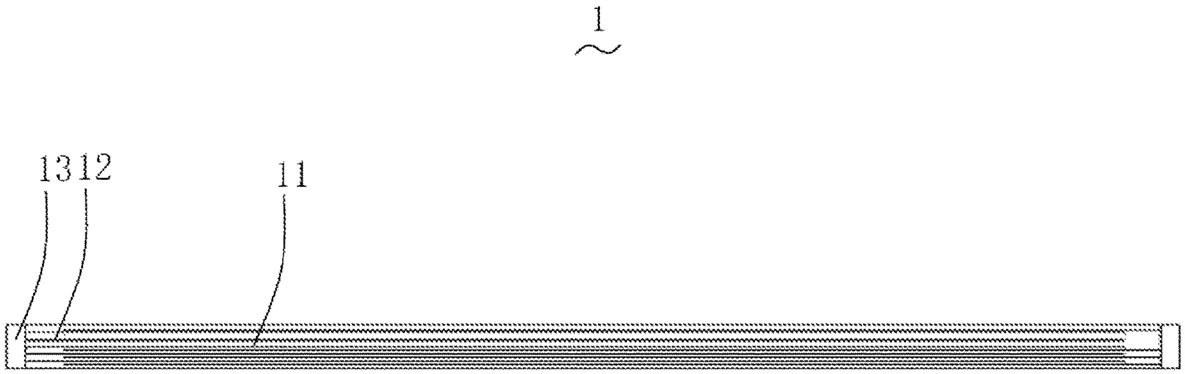
FIG. 3 is a schematic structural diagram of a piezoelectric body of the piezoelectric vibrator according to Embodiment 1 of the present disclosure.

Referring to FIG. 3, the piezoelectric body 1 includes a plurality of stacked internal electrodes 11 having different polarities, a plurality of stacked piezoelectric layers 12, and external electrodes 13. The plurality of stacked piezoelectric layers 12 surround the peripheries of the plurality of internal electrodes 11 and are electrically connected to the internal electrodes 11. The external electrodes 13 surround the peripheries of the piezoelectric layers 12 and are electrically connected to the plurality of piezoelectric layers 12.

The first direction X is a length direction of the piezoelectric body 1. The first direction X is parallel to a plane of the piezoelectric body 1.

The plurality of internal electrodes 11 and the plurality of piezoelectric layers 12 are stacked along the second direction Y. The internal electrodes 11 having different polarities are alternately arranged and are connected to corresponding external electrodes 13 thereof.

The second direction Y is a thickness direction of the piezoelectric body 1. The first direction X and the second direction Y are perpendicular to each other.

In Embodiment 1, the piezoelectric body 1 is made of single-layer or multi-layer piezoelectric ceramics. Optionally, the plurality of piezoelectric layers 12 are all made of single-layer lead zirconate titanate ceramic, or the plurality of piezoelectric layers 12 are all made of multi-layer lead zirconate titanate ceramics. The piezoelectric body 1 has a first telescopic direction less than or equal to 10 mm and a second telescopic direction less than or equal to 100 mm. The thickness of the piezoelectric body 1 may be appropriately optimized and selected according to an application scenario and a number of the lead zirconate titanate ceramic layers.

Figure 4:
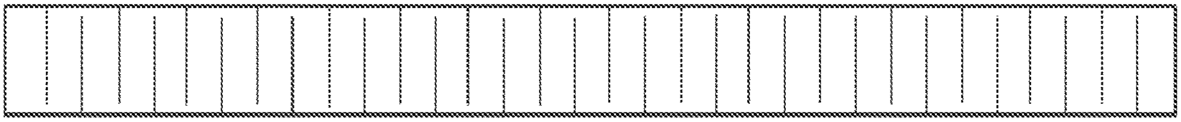
FIG. 4 is another schematic structural diagram of the piezoelectric body of the piezoelectric vibrator according to Embodiment 1 of the present disclosure.

In another embodiment, referring to FIG. 4, the piezoelectric body 1 is made of multi-layer piezoelectric ceramics polarized along the first direction X. A direction of strain displacement of the piezoelectric body 1 is in a same dimension as a direction of an electric field applied to the piezoelectric body 1, and an inverse piezoelectric effect in a direction d33 is adopted. In the operating mode, it is needed to apply a pre-tension force to the piezoelectric stack to prevent failure of the piezoelectric body 1.

Figure 5:
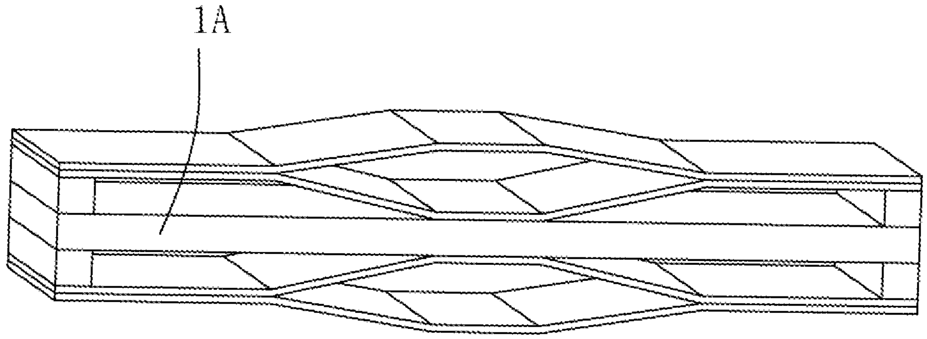
FIG. 5 is a schematic diagram of a principle of an amplification factor of the piezoelectric vibrator according to Embodiment 1 of the present disclosure.

The piezoelectric body 1 is in a shape of a strip or a square or a circle. In Embodiment 1, the piezoelectric body 1 is in a shape of a square. Certainly, the piezoelectric body 1 is not limited to the above shapes. In another embodiment, referring to FIG. 5, the piezoelectric body 1A is in a shape of a strip.

The amplifying unit 2 is in a shape of a rectangle or a square or a circle. In Embodiment 1, the piezoelectric body 1 is in a shape of a circle, and the amplifying unit 2 is in a shape of a circle, which is in a same shape as the piezoelectric body 1.

The amplifying unit 2 is a flat structure 20 formed by an elastic reinforcing element and having a same shape as the piezoelectric body 1. The elastic reinforcing element is a metal sheet. The metal sheet is made of metal materials such as titanium, titanium alloy, stainless steel, copper, and copper alloy. The elastic reinforcing element may be formed by stamping, so manufacturing costs of the piezoelectric vibrator 100 are relatively low.

Specifically, the amplifying unit 2 includes a first section 21, two second sections 22, two third sections 23, a fourth section 24, two fifth sections 25, and two sixth sections 26. The first section 21 is fixed to the piezoelectric body 1 and includes two opposite ends. The two second sections 22 bend and obliquely extend, in a direction away from the piezoelectric body 1, from the two opposite ends of the first section 21 respectively. The two third sections 23 bend and extend, in a direction away from the first section 21, from the two second sections 22 respectively, and are spaced apart from the piezoelectric body 1. The fourth section 24 is spaced apart from the first section 21 and is mirror-symmetrical with the first section 21. The two fifth sections 25 extend outward from the fourth section 24 and are respectively spaced apart from and mirror-symmetrical with the two second sections 22. The two sixth sections 26 are respectively fitted to the two third sections 23 and mirror-symmetrical with the two third sections 23. Each of the third sections 23 is attached and fixed to a corresponding one of the sixth sections 26 and constitutes a thickened end portion 2A of the amplifying unit 2 together with the corresponding sixth section 26.

The thickened end portion 2A is supported on and fixed to the piezoelectric body 1. In Embodiment 1, the thickened end portion 2A is supported on and fixed to the piezoelectric body 1 through the fixed end block 3. The fixed end block 3 is electrically insulated from the piezoelectric body 1. In specific manufacturing, the fixed end block 3 is connected to two ends of the piezoelectric body 1 by means of glue bonding or the like.

The first section 21, the second sections 22, the fourth section 24, and the fifth sections 25 jointly constitute the flat structure 20. The flat structure 20 is fixed to an end portion of the piezoelectric body 1 close to an outer edge, so as to make full use of mechanical deformation of the piezoelectric body 1. The amplifying unit 2 adopts a triangular amplification principle, and the amplifying unit 2 on one side of the piezoelectric body 1 adopts a double-layer elastic reinforcing element to form a prismatic amplification unit structure, that is, the flat structure 20.

The sixth section 26 forms a platform for connecting a load required to be driven, or for a fixed substrate. In the amplifying unit 2, an angle of a lower part of a prism cannot be too small, generally larger than an angle of an upper part of the prism, and rigidity of the amplifying unit 2 cannot be too large, so as to prevent an excessive limitation on telescopic displacement of the piezoelectric layer.

In Embodiment 1, a length of the thickened end portion 2A along the first direction X is equal to half of a length of the flat structure 20 along the first direction X. The structure enables the flat structure 20 to realize a prismatic amplification unit structure.

When the piezoelectric body 1 is subjected to an external voltage, due to the inverse piezoelectric effect, the piezoelectric body 1 expands or contracts along the first direction X parallel to a plane of the piezoelectric body 1, that is, perpendicular to a direction of an electric field of the internal electrodes, namely a d31 effect. At the same time, the amplifying unit 2 contracts or expands along the second direction Y. The amplifying unit 2 can not only convert a movement along the first direction X to a movement along the second direction Y, but also amplify displacement of the piezoelectric body 1 along the first direction X, so as to alleviate the problem of small response displacement or a requirement for a high stimulus voltage of the piezoelectric body 1. By use of an inverse piezoelectric effect of a piezoelectric material of the piezoelectric body 1, the piezoelectric vibrator 100 is not affected by an electromagnetic environment. A pre-tension force may be applied. The piezoelectric material employs a telescopic mode. Compared with a bending mode, reliability of the material is greatly improved. Therefore, the piezoelectric vibrator 100 of the present disclosure has a small volume, fast response, an adjustable resonance frequency, a wide operating frequency, and high energy conversion efficiency. Therefore, the piezoelectric vibrator 100 of the present invention is used as a piezoelectric motor for tactile feedback and applied to many fields such as mobile phones, tablets, notebook computers, vehicles, and stylus pens. The piezoelectric vibrator 100 of the present disclosure is further used as a sounding unit of a speaker and applied to basic electronic devices in application fields such as sound on display and bone conduction. The piezoelectric vibrator 100 of the present disclosure is also used as a pressure sensor to sense an external pressure change and convert the external pressure change into a voltage signal.

In some embodiments, two amplifying units 2 are provided. The two amplifying units 2 are respectively located on two opposite sides of the piezoelectric body 1. This configuration is conducive to further improving a displacement amplification ratio of the piezoelectric vibrator 100 of the present disclosure.

Figure 6:
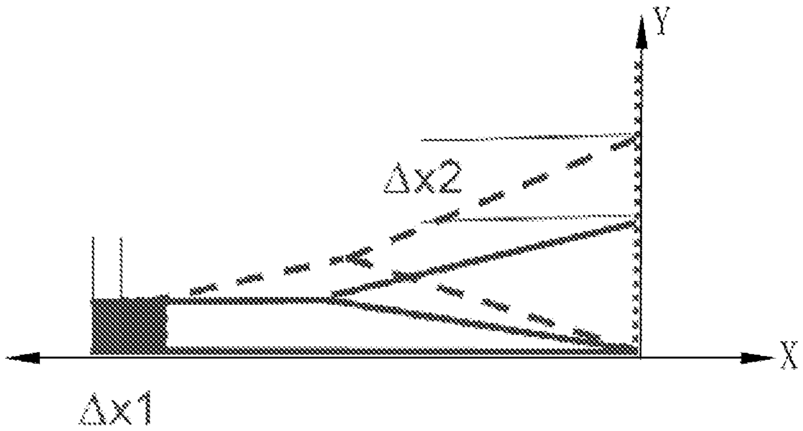
FIG. 6 is a another three-dimensional view of the piezoelectric vibrator according to Embodiment 1 of the present disclosure.

In Embodiment 1, the first section 21 is fixed to a central position of the piezoelectric body 1. The amplifying unit 2 has a symmetrical structure with respect to the first section 21. The structure converts lateral displacement of the piezoelectric body 1 into longitudinal displacement of the amplifying unit 2. Referring to FIG. 6, an amplification factor of the piezoelectric vibrator 100 is a ratio of a displacement amount of the piezoelectric body 1 along the first direction X to a displacement amount of the amplifying unit 2 along the second direction Y. The displacement amount of the piezoelectric body 1 along the first direction X is Δx1. The displacement amount of the amplifying unit 2 along the second direction Y is Δx2. The following formula is satisfied: the amplification factor of the piezoelectric vibrator 100=Δx2/Δx1. Therefore, the amplifying unit 2 can be formed by combining two layers of metal brackets, and a total amplification factor is a sum of amplification factors of upper and lower parts of a prism formed by the metal brackets, thereby further increasing the amplification factor. In a specific design, the amplification factor of the amplifying unit 2 can be flexibly designed, and various design goals can be achieved by changing opening angles and structures of the upper and lower metal brackets respectively.

The fixed end block 3 is made of metal. The fixed end block 3 made of metal is conducive to manufacturing and forming.

The fixed end block 3 is respectively connected to the piezoelectric body 1 and the amplifying unit 2 and located on an edge of the piezoelectric body 1. The amplifying unit 2 is connected to an end portion edge of the piezoelectric body 1 to maximize the use of deformation generated by the piezoelectric body 1. In some embodiments, an extension beam of the sixth section 26 is parallel to a surface of the piezoelectric body 1, and the sixth sections 26 are tightly adhered or brazed to two ends of the piezoelectric body 1 through the thickened end portion 2A, so as to prevent relative motion between the amplifying structure and the piezoelectric layer.

In Embodiment 1, at least two fixed end blocks 3 are provided. Each of the amplifying units 2 is connected to the piezoelectric body 1 through one of the fixed end blocks 3.

Embodiment 2

Embodiment 2 of the present disclosure provides a piezoelectric vibrator 200.

The piezoelectric vibrator 200 in Embodiment 2 of the present disclosure is basically the same as the piezoelectric vibrator 100 in Embodiment 1 of the present disclosure. The piezoelectric vibrator 200 in Embodiment 2 of the present disclosure is different from the piezoelectric vibrator 100 as follows.

Figure 7:
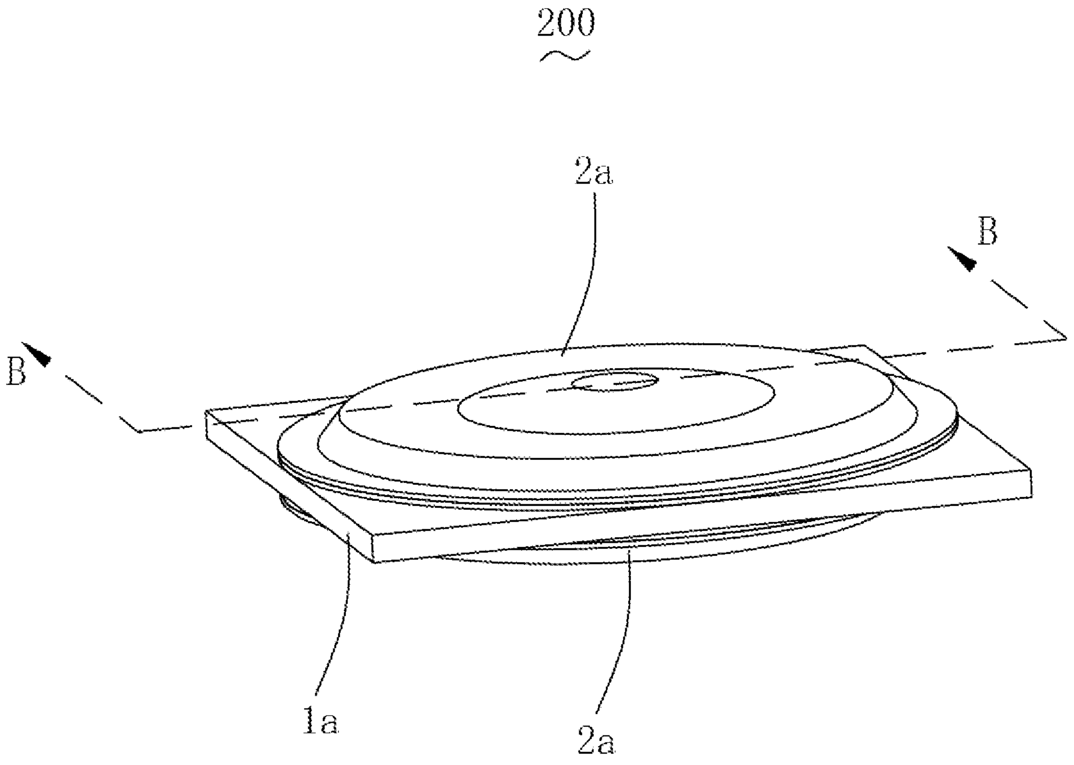
FIG. 7 is a three-dimensional view of a piezoelectric vibrator according to Embodiment 2 of the present disclosure.
Figure 8:
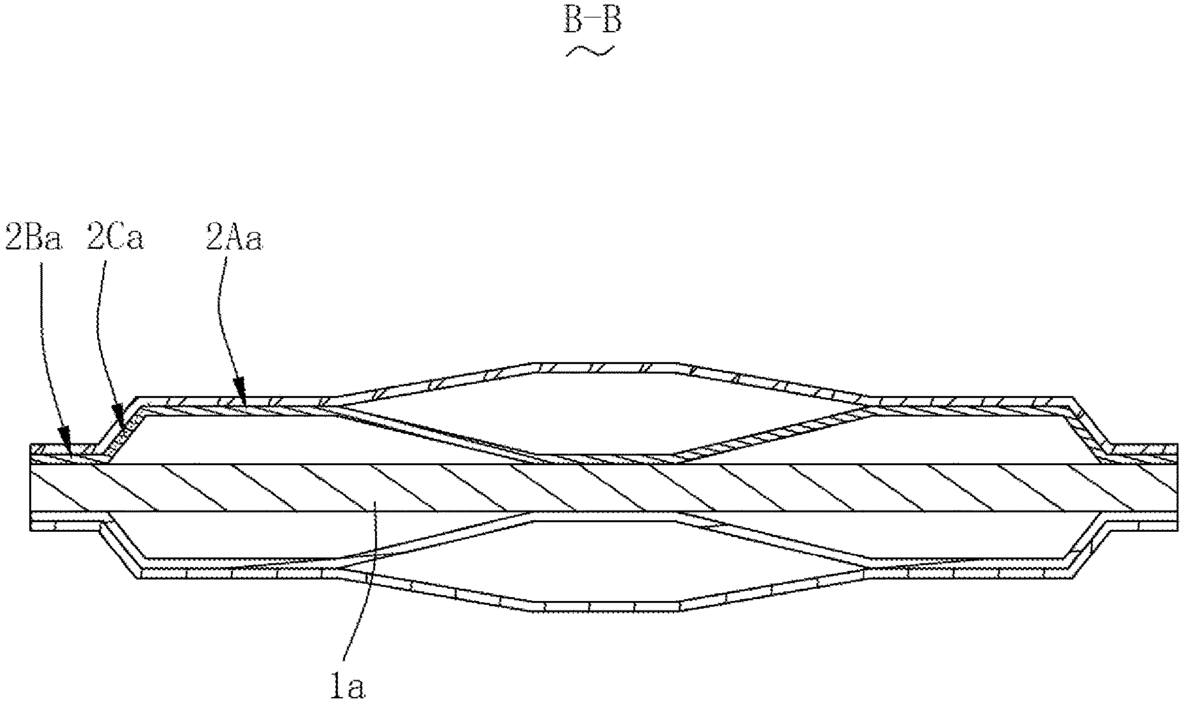
FIG. 8 is a cross-sectional view taken along line B-B in FIG. 7.

Referring to FIG. 7 and FIG. 8, the amplifying unit 2*a* further includes a bending portion 2Ca bending and obliquely extending from the thickened end portion 2Aa to an edge of the piezoelectric body 1*a* and a fixed portion 2Ba fixed to the edge of the piezoelectric body 1*a*. The fixed portion 2Ba is electrically insulated from the piezoelectric body 1*a*.

The thickened end portion 2Aa functions as a parallel beam, the bending portion 2Ca is arranged by obliquely and downwards from the thickened end portion 2Aa, and the fixed portion 2Ba is fixed to the piezoelectric body 1*a*. The structure can realize a same function as the amplifying unit 2 of the piezoelectric vibrator 100 in Embodiment 1 of the present disclosure. Certainly, compared with the amplifying unit 2, the amplifying unit 2*a* has certain differences in implementation difficulty and performance.

Compared with the piezoelectric vibrator 100 in Embodiment 1, the bending portion 2Ca and the fixed portion 2Ba in Embodiment 2 jointly constitute the fixed end block 3 of the piezoelectric vibrator 100 in Embodiment 1.

According to the piezoelectric vibrator 200 in Embodiment 2 of the present disclosure, the amplifying unit 2*a* is directly connected to the piezoelectric body 1*a* through the bending portion 2Ca and the fixed portion 2Ba, so there is no need to additionally arrange the fixed end block 3 of the piezoelectric vibrator 100 in Embodiment 1, which simplifies the entire solution and facilitates machining and manufacturing of the piezoelectric vibrator 200. The piezoelectric vibrator 200 in Embodiment 2 of the present disclosure has certain change in the structure due to the addition of the bending portion 2Ca, and displacement amplification performance thereof is inferior to that of the piezoelectric vibrator 100 in Embodiment 1 of the present invention.

In Embodiment 2, at least one amplifying unit 2*a* is provided, the amplifying unit 2*a* is located on one side of the piezoelectric body 1*a*, and the other side of the piezoelectric body 1*a* is provided with a structure having a same shape as the piezoelectric body 1*a*. The other side of the piezoelectric body 1*a* is connected to another amplifying unit 2*a* or another feasible structure configured to buffer amplification. That is, the structure arranged on the other side of the piezoelectric body 1*a* may be another structure adopted according to an actual design requirement, for example, another amplifying unit 2*a*, or another feasible structure may alternatively be adopted as required.

Figure 9:
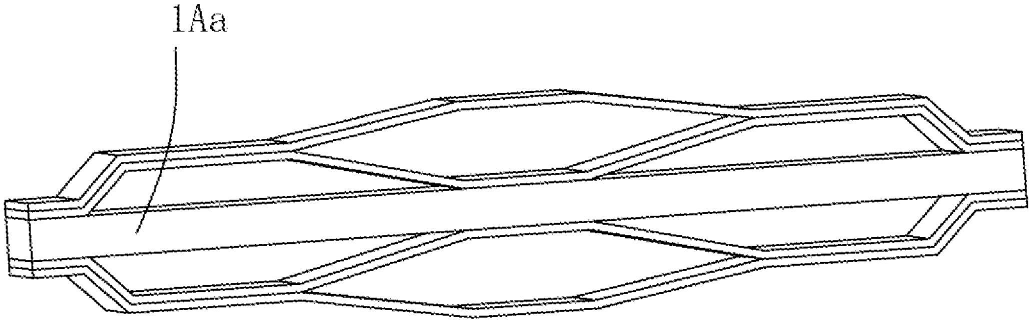
FIG. 9 is another three-dimensional view of the piezoelectric vibrator according to Embodiment 2 of the present disclosure.

In another embodiment, referring to FIG. 9, the piezoelectric body 1Aa is in a shape of a strip.

Embodiment 3

Embodiment 3 of the present disclosure provides a piezoelectric vibrator 300.

The piezoelectric vibrator 300 in Embodiment 3 of the present disclosure is basically the same as the piezoelectric vibrator 100 in Embodiment 1 of the present invention. The piezoelectric vibrator 300 in Embodiment 3 of the present disclosure is different from the piezoelectric vibrator 100 in Embodiment 1 of the present disclosure as follows.

Figure 10:
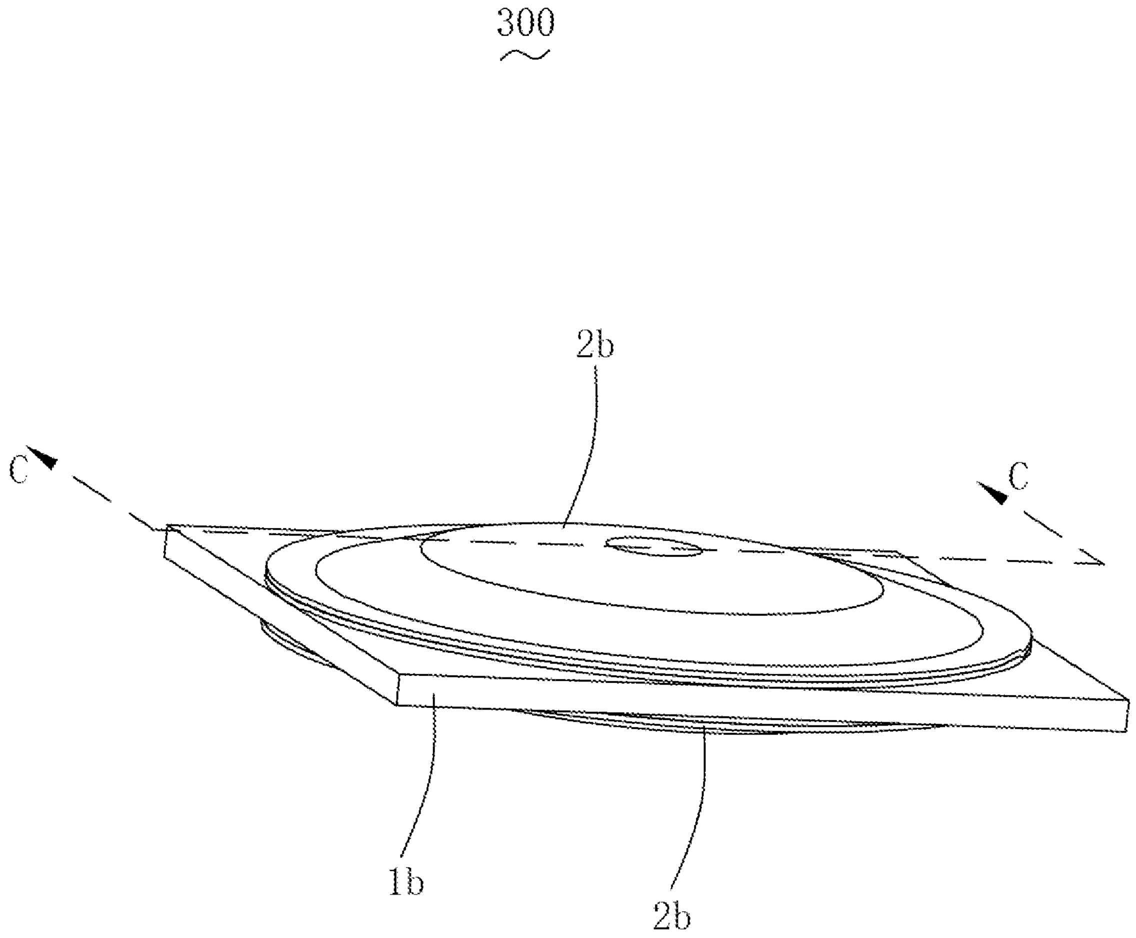
FIG. 10 is a three-dimensional view of a piezoelectric vibrator according to Embodiment 3 of the present disclosure.
Figure 11:
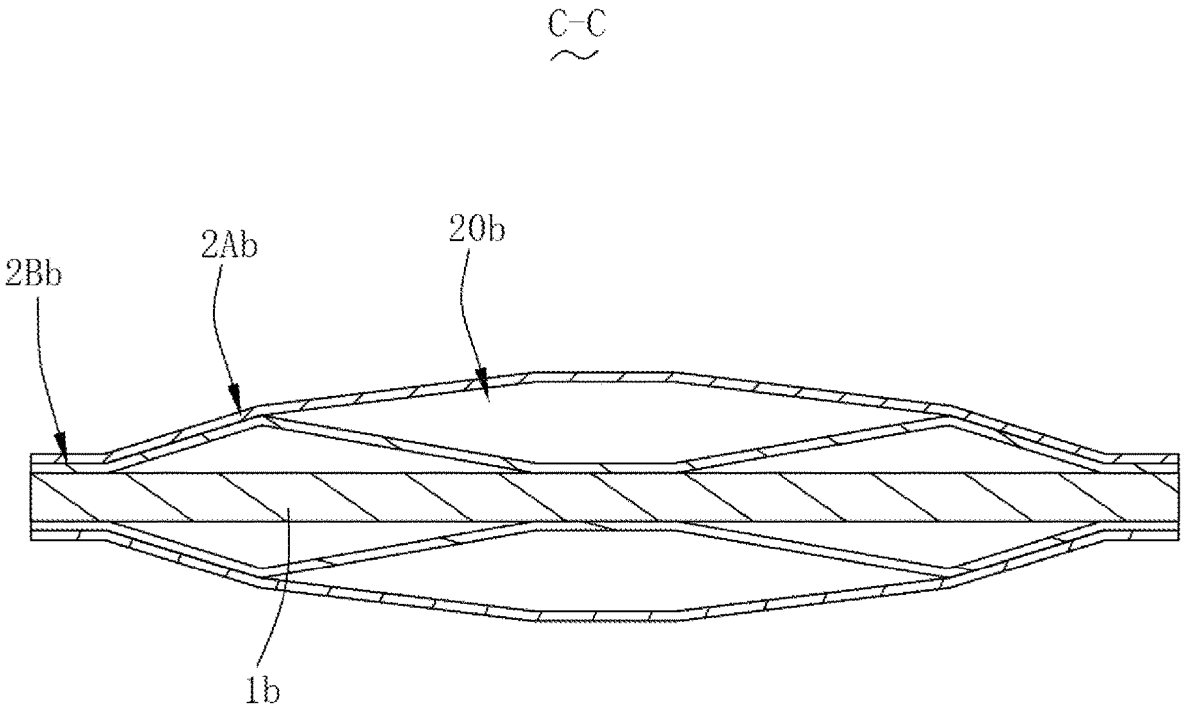
FIG. 11 is a cross-sectional view taken along line C-C in FIG. 10.

Referring to FIG. 10 and FIG. 11, the amplifying unit 2*b* further includes a fixed portion 2Bb extending from the thickened end portion 2Ab and fixed to an edge of the piezoelectric body 1*b*. The thickened end portion 2Ab obliquely bends from the flat structure 20*b* and extends from the flat structure 20*b* to the edge of the piezoelectric body 1*b*. The fixed portion 2Bb is electrically insulated from the piezoelectric body 1*b*.

Compared with the piezoelectric vibrator 100 in Embodiment 1, the fixed portion 2Bb in Embodiment 3 plays the role of the fixed end block 3 of the piezoelectric vibrator 100 in Embodiment 1.

According to the piezoelectric vibrator 300 in Embodiment 3 of the present disclosure, the amplifying unit 2*b* is directly connected to the piezoelectric body 1*b* through the fixed portion 2Bb, so there is no need to additionally arrange the fixed end block 3 of the piezoelectric vibrator 100 in Embodiment 1, which simplifies the entire solution and facilitates machining and manufacturing of the piezoelectric vibrator 300. However, the structure is connected to the piezoelectric body 1*b* through an inclined cantilever, that is, the inclined thickened end portion 2Ab, and a length of the inclined thickened end portion 2Ab can be changed, thereby adjusting the amplification factor of the entire amplifying structure. Moreover, since the thickened end portion 2Ab as a cantilever has certain deformation, displacement amplification performance thereof is inferior to the displacement amplification performance of both the piezoelectric vibrator 100 in Embodiment 1 and the piezoelectric vibrator 200 in Embodiment 2 of the present disclosure.

In Embodiment 3, at least one amplifying unit 2*b* is provided, the amplifying unit 2*b* is located on one side of the piezoelectric body 1*b*, and the other side of the piezoelectric body 1*b* is provided with a structure having a same shape as the piezoelectric body 1*b*. The other side of the piezoelectric body 1*b* is connected to another amplifying unit 2*b* or a feasible structure configured to provide buffer amplification. That is, the structure arranged on the other side of the piezoelectric body 1*b* may be a structure adopted according to an actual design requirement, for example, another amplifying unit 2*b*, or a feasible structure may alternatively be adopted as required.

Figure 12:
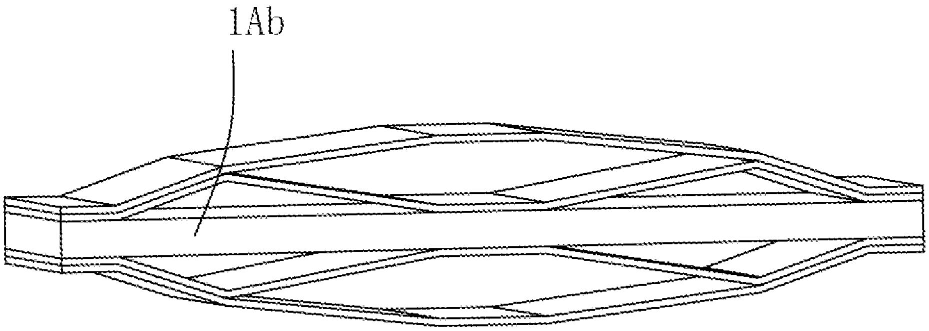
FIG. 12 is another three-dimensional view of the piezoelectric vibrator according to Embodiment 3 of the present disclosure.

In another embodiment, referring to FIG. 12, the piezoelectric body 1Ab is in a shape of a strip.

Embodiment 4

Embodiment 4 of the present disclosure provides a piezoelectric vibrator 400.

The piezoelectric vibrator 400 in Embodiment 4 of the present disclosure is basically the same as the piezoelectric vibrator 100 in Embodiment 1 of the present disclosure. The piezoelectric vibrator 400 in Embodiment 4 of the present disclosure is different from the piezoelectric vibrator 100 in Embodiment 1 of the present disclosure as follows.

Figure 13:
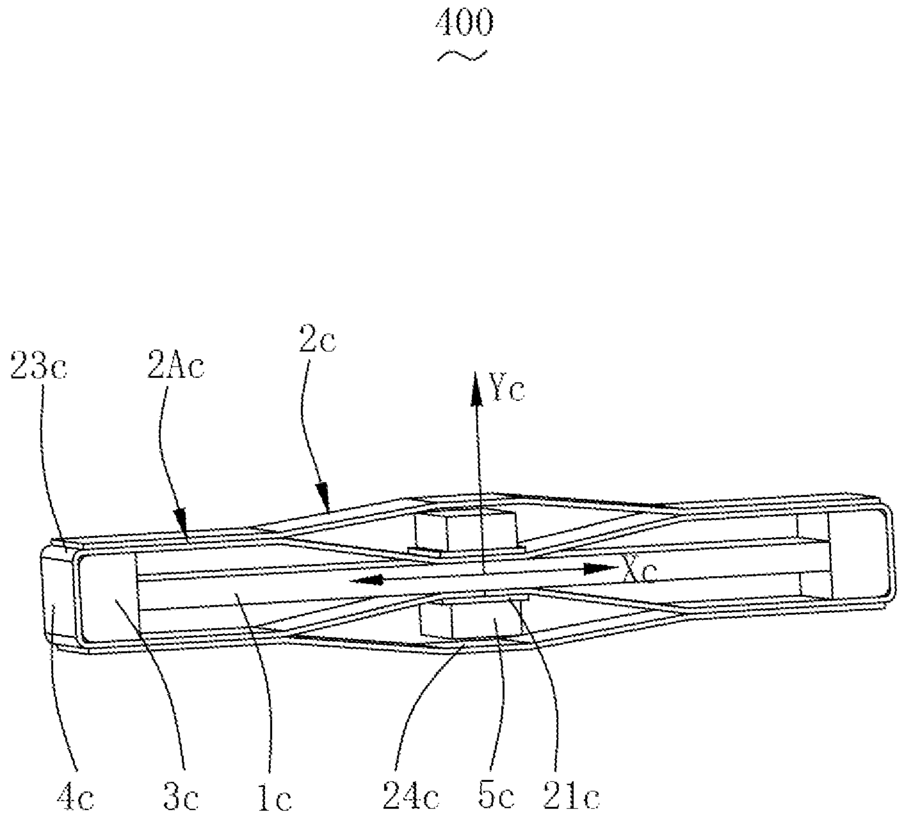
FIG. 13 is a three-dimensional view of a piezoelectric vibrator according to Embodiment 4 of the present disclosure.

Referring to FIG. 13, specifically, at least one fixed end block 3*c* is provided. The fixed end block 3*c* is fixed to an outer side of the piezoelectric body 1*c* along the first direction Xc. The thickened end portions 2Ac corresponding to the two amplifying units 2*c* are respectively fixed to two opposite sides of the fixed end block 3*c* along the second direction Yc.

The piezoelectric vibrator 400 further includes a connecting section 4*c*. The connecting section 4*c* is made of a same metal as the amplifying unit 2*c*. The connecting section 4*c* is fixed to a side of the fixed end block 3*c* away from the piezoelectric body 1*c* along the first direction Xc. The third section 23*c* of the amplifying unit 2*c* is connected to the connecting section 4*c*. In the piezoelectric vibrator 400, the fixed end block 3*c* is an integral structure and has two parts on two sides of the piezoelectric body 1*c*, and the third section 23*c* of the amplifying unit 2*c* and the connecting section 4*c* can be integrally formed, thereby improving the reliability of the piezoelectric vibrator 400.

At the end region of the piezoelectric vibrator 400, the connecting section 4*c* and one fixed end block 3*c* adopt an integral structure to realize a vertically integral rigid body, and an outer side of the piezoelectric vibrator 400 is welded to the third section 23*c* through the connecting section 4*c* to provide higher-strength support.

The piezoelectric body 1*c* is connected to the fixed end block 3*c* by a pre-tension force, and the piezoelectric body 1*c* only bears pressure but not tension, so as to prevent the problem of insufficient strength due to glue connection, or only serves as a means of auxiliary positioning, thereby improving the reliability of the piezoelectric vibrator 400.

In the structure of the piezoelectric vibrator 400, the two amplifying units 2*c* further constitute a complete elastic amplifying frame. After the overall assembly is completed, the piezoelectric body 1*c* may be positioned and pre-tensioned to simplify the assembly process, so that the piezoelectric vibrator 400 is easy to manufacture.

In order to increase the amplification factor of the amplifying unit 2*c*, the piezoelectric vibrator 400 in Embodiment 4 of the present disclosure is structurally the same as the piezoelectric vibrator 100 in Embodiment 1 of the present disclosure, and two amplifying units 2*c* are provided. The two amplifying units 2*c* are respectively located on two opposite sides of the piezoelectric body 1*c*.

In Embodiment 4, the piezoelectric vibrator 400 further includes a buffer member 5*c*. Two buffer members 5*c* are provided. Each of the two buffer members 5*c* is fixed to a side of the corresponding first section 21*c* away from the piezoelectric body 1*c* and arranged apart from the fourth section 24*c*.

The buffer member 5*c* is made of a polymer. Optionally, the buffer member 5*c* is made of a polymer such as foam or rubber. In Embodiment 4, the buffer member 5*c* is made of foam. The buffer member 5*c* that uses foam for a buffer effect prevents structural collapse and failure. The buffer member 5*c* is used for position limiting and used as a buffer structure to prevent structure failure caused by excessive extrusion due to damages to the structure caused by excessively large pressure on the piezoelectric vibrator 400, thereby improving the reliability of the piezoelectric vibrator 400.

Embodiment 5

Embodiment 5 of the present disclosure provides a piezoelectric vibrator 500.

The piezoelectric vibrator 500 in Embodiment 5 of the present disclosure is basically the same as the piezoelectric vibrator 100 in Embodiment 1 of the present disclosure. The piezoelectric vibrator 500 in Embodiment 5 of the present disclosure is different from the piezoelectric vibrator 100 in Embodiment 1 of the present disclosure as follows.

Figure 14:
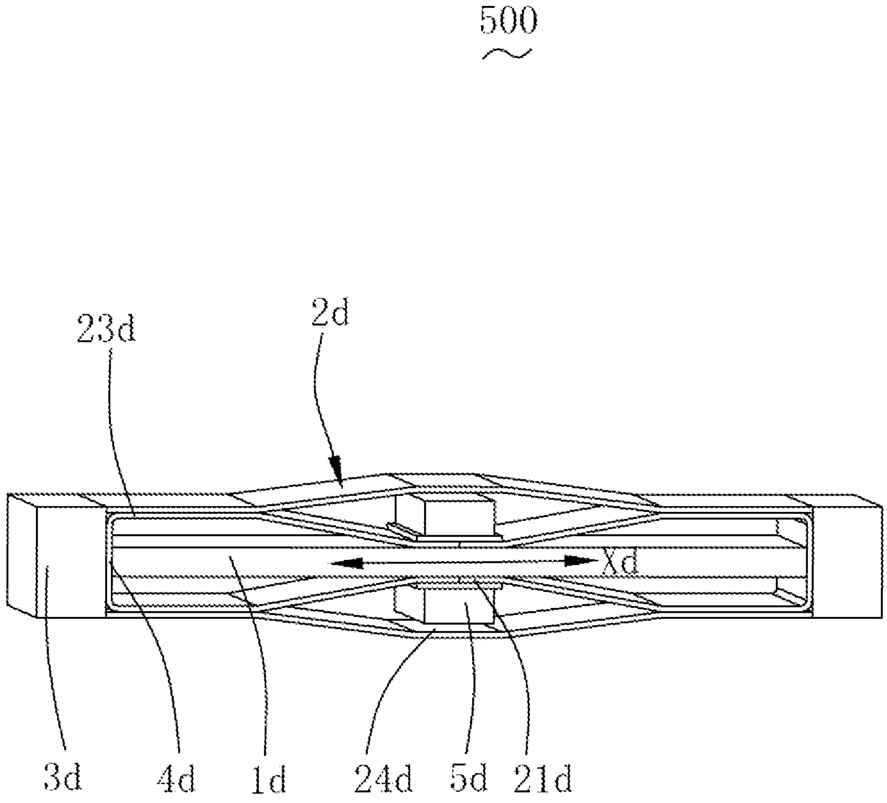
FIG. 14 is a three-dimensional view of a piezoelectric vibrator according to Embodiment 5 of the present disclosure.

Referring to FIG. 14, specifically, the piezoelectric vibrator 500 further includes a connecting section 4*d*. The connecting section 4*d* is made of a same metal as the amplifying unit 2*d*. The connecting section 4*d* is fixed to an outer side of the piezoelectric body 1*d* along the first direction Xd. The third sections 23*d* corresponding to the two amplifying units 2*d* are respectively connected to the connecting section 4*d*.

At least one fixed end block 3*d* is provided. The fixed end block 3*d* is fixed to a side of the connecting section 4*d* away from the piezoelectric body 1*d* along the first direction Xd. The structure of the piezoelectric vibrator 500 is that the fixed end block 3*d* is placed on outermost sides of the piezoelectric body 1*d* and the amplifying unit 2*d*.

The structural design of the piezoelectric vibrator 500 that the fixed end block 3*d* is welded to an end portion of the connecting section 4*d* realizes a vertically overall rigid body, and an inner side is welded to the third section 23*d* through the connecting section 4*d*, which provides higher-strength support, thereby improving reliability of the piezoelectric vibrator 500.

The piezoelectric body 1*d* is connected to the fixed end block 3*d* by a pre-tension force, and the piezoelectric body 1*d* only bears pressure but not tension, so as to prevent the problem of insufficient strength of glue connection, or only serves as a means of auxiliary positioning, thereby improving the reliability of the piezoelectric vibrator 500.

In the structure of the piezoelectric vibrator 500, the two amplifying units 2*d* further constitute a complete elastic amplifying frame. After the overall assembly is completed, the piezoelectric body 1*d* may be positioned and pretensioned to simplify an assembly process, so that the piezoelectric vibrator 500 is easy to manufacture.

In order to increase the amplification factor of the amplifying unit 2*d*, the piezoelectric vibrator 500 in Embodiment 5 of the present disclosure is structurally the same as the piezoelectric vibrator 100 in Embodiment 1 of the present disclosure, and two amplifying units 2*d* are provided. The two amplifying units 2*d* are respectively located on two opposite sides of the piezoelectric body 1*d*.

In Embodiment 5, the piezoelectric vibrator 500 further includes two buffer members 5*d*. Each of the two buffer members 5*d* is fixed to a side of the corresponding first section 21*d* away from the piezoelectric body 1*d* and arranged apart from the fourth section 24*d*.

The buffer member 5*d* is made of a polymer. Optionally, the buffer member 5*d* is made of a polymer such as foam or rubber. In Embodiment 5, the buffer member 5*d* is made of foam. The buffer member 5*d* uses the cushioning effect of the foam to prevent structural collapse and failure. The buffer member 5*d* can be used for position limiting and used as a buffer structure to prevent structure failure caused by excessive extrusion due to damages to the structure caused by excessively large pressure on the piezoelectric vibrator 500, thereby improving the reliability of the piezoelectric vibrator 500.

Embodiment 6

Embodiment 6 of the present disclosure provides a piezoelectric vibrator 600.

The piezoelectric vibrator 600 in Embodiment 6 of the present disclosure is basically the same as the piezoelectric vibrator 500 in Embodiment 5 of the present disclosure. The piezoelectric vibrator 600 in Embodiment 6 of the present disclosure is different from the piezoelectric vibrator 500 in Embodiment 5 of the present disclosure as follows.

Figure 15:
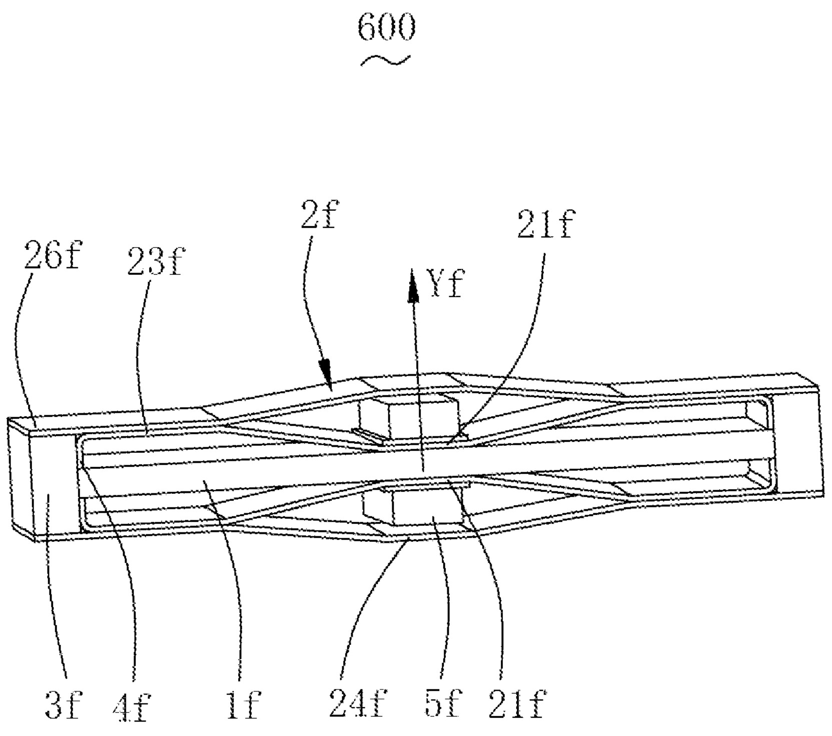
FIG. 15 is a three-dimensional view of a piezoelectric vibrator according to Embodiment 6 of the present disclosure.

Referring to FIG. 15, specifically, the sixth sections 26*f* corresponding to the two amplifying units 2*f* respectively extend in a direction away from the corresponding first section 21*f*, and two opposite sides of the fixed end block 3*f* along the second direction Yf are connected extension parts of the two sixth sections 26*f*. The connection manner between the amplifying unit 2*f* and the fixed end block 3*f* in the structure of the piezoelectric vibrator 600 is a right-angle cladding mode.

In the piezoelectric vibrator 600, the fixed end block 3*f* is welded to an end portion of the connecting section 4*f* to realize a vertically overall rigid body, and an inner side is welded to the third section 23*f* through the connecting section 4*f*, which provides higher-strength support, thereby improving reliability of the piezoelectric vibrator 600.

The piezoelectric body 1*f* is connected to the fixed end block 3*f* by a pre-tension force, and the piezoelectric body 1*f* only bears pressure but not tension, so as to prevent the problem of insufficient strength of glue connection, or only serves as a means of auxiliary positioning, thereby improving the reliability of the piezoelectric vibrator 600.

In the structure of the piezoelectric vibrator 600, the two amplifying units 2*f* further constitute a complete elastic amplifying frame. After the overall assembly is completed, the piezoelectric body 1*f* may be positioned and pre-tensioned to simplify an assembly process, so that the piezoelectric vibrator 600 is easy to manufacture.

In Embodiment 6, the piezoelectric vibrator 600 further includes a two buffer members 5*f*. Each of the two buffer members 5*f* is fixed to a side of the corresponding first section 21*f* away from the piezoelectric body 1*f* and arranged apart from the corresponding fourth section 24*f*.

The buffer member 5*f* is made of a polymer. Optionally, the buffer member 5*f* is made of a polymer such as foam or rubber. In Embodiment 6, the buffer member 5*f* is made of foam. The buffer member 5*f* uses the cushioning effect of the foam to prevent structural collapse and failure. The buffer member 5*f* can be used for position limiting and used as a buffer structure to prevent structure failure caused by excessive extrusion due to damages to the structure caused by excessively large pressure on the piezoelectric vibrator 600, thereby improving the reliability of the piezoelectric vibrator 600.

Embodiment 7

Embodiment 7 of the present disclosure provides a piezoelectric vibrator 700.

The piezoelectric vibrator 700 in Embodiment 7 of the present disclosure is basically the same as the piezoelectric vibrator 100 in Embodiment 1 of the present disclosure. The piezoelectric vibrator 700 in Embodiment 7 of the present disclosure is different from the piezoelectric vibrator 100 in Embodiment 1 of the present disclosure as follows.

Figure 16:
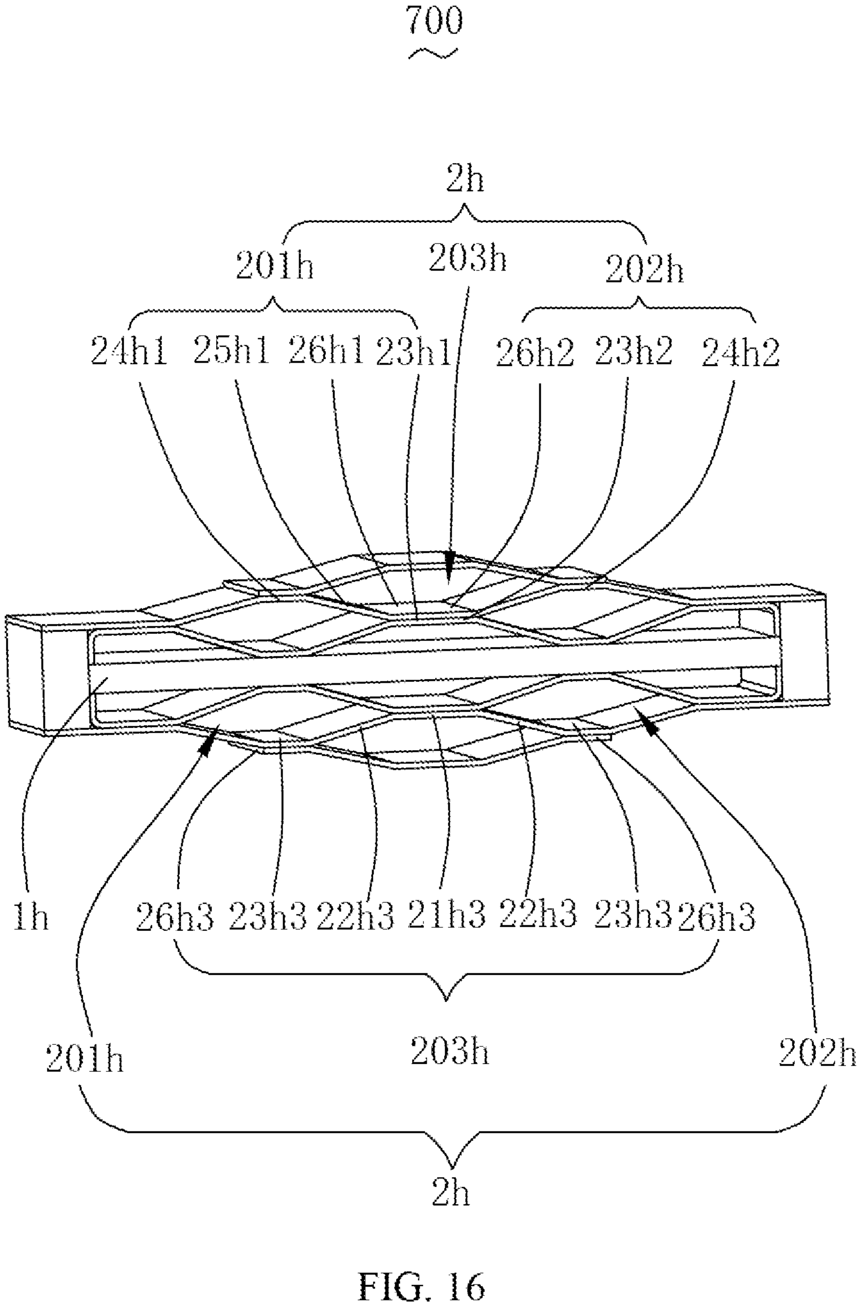
FIG. 16 is a schematic exploded view of a partial structure of a piezoelectric vibrator according to Embodiment 7 of the present disclosure.

Referring to FIG. 16, specifically, three amplifying units 2*h* are provided and are respectively a first amplifying unit 201*h*, a second amplifying unit 202*h*, and a third amplifying unit 203*h*. The three amplifying units 2*h* are all located on a same side of the piezoelectric body 1*h* and jointly form a three-layer elastic element structure. The first amplifying unit 201*h* and the second amplifying unit 202*h* are connected side by side. The third section 23*h*1 of the first amplifying unit 201*h* and the third section 23*h*2 of the second amplifying unit 202*h* formed into one piece, that means the third section 23*h*1 and the third section 23*h*2 are made of a same metal sheet. The sixth section 26*h*1 of the first amplifying unit 201*h* and the sixth section 26*h*2 of the second amplifying unit 202*h* formed into one piece, that means the sixth section 26*h*1 and the sixth section 26*h*2 are made of a same metal sheet. The third amplifying unit 203*h* is arranged on a side of the first amplifying unit 201*h* and the second amplifying unit 202*h* away from the piezoelectric body 1*h*. The first section 21*h*3 of the third amplifying unit 203*h*, the sixth section 26*h*1 of the first amplifying unit 201*h*, and the sixth section 26*h*2 of the second amplifying unit 202*h* are all made of a same metal sheet. The two second sections 22*h*3 of the third amplifying unit 203*h* are respectively the fifth sections 25*h*1 extending from the connected sixth sections 26*h*1 of the first amplifying unit 201*h* and the second amplifying unit 202*h*. The two third sections 23*h*3 of the third amplifying unit 203*h* are respectively the fourth section 24*h*1 of the first amplifying unit 201*h* and the fourth section 24*h*2 of the second amplifying unit 202*h*. The two sixth sections 26*h*3 of the third amplifying unit 203*h* are attached and fixed to the fourth section 24*h*1 of the first amplifying unit 201*h* and the fourth section 24*h*2 of the second amplifying unit 202*h* respectively. The amplifying unit 2*h* in the overall structure of the piezoelectric vibrator 700 adopts a design of a three-layer elastic element structure, which can further increase a displacement amplification factor. The three-layer elastic element structure is in a same piezoelectric body 1*h*. Based on parallel distribution of two-layer prismatic amplification structures, a third layer of the elastic reinforcing element may be arranged thereon, thereby forming a multi-layer amplifying structure. The three-layer elastic element structure has a larger displacement amplification factor, which is a sum of amplification factors of the three elastic reinforcing element layers.

In Embodiment 7, the three-layer elastic element structure may be designed in one piece by pre-tensioning and glue-free fixing.

In order to increase the amplification factor of the amplifying unit 2*h*, the piezoelectric vibrator 700 in Embodiment 7 of the present invention is structurally the same as the piezoelectric vibrator 100 in Embodiment 1 of the present invention, in which two amplifying units 2*c* are provided and the two amplifying units 2*c* are respectively located on two opposite sides of the piezoelectric body 1*h*.

Embodiment 8

Embodiment 8 of the present disclosure provides a piezoelectric vibrator assembly 800.

The piezoelectric vibrator assembly 800 includes any one of at least two piezoelectric vibrators 100, two piezoelectric vibrators 200, two piezoelectric vibrators 300, two piezoelectric vibrators 400, two piezoelectric vibrators 500, two piezoelectric vibrators 600, and two piezoelectric vibrators 700. The piezoelectric vibrator assembly 800 can enhance strength of a piezoelectric motor.

Figure 17:
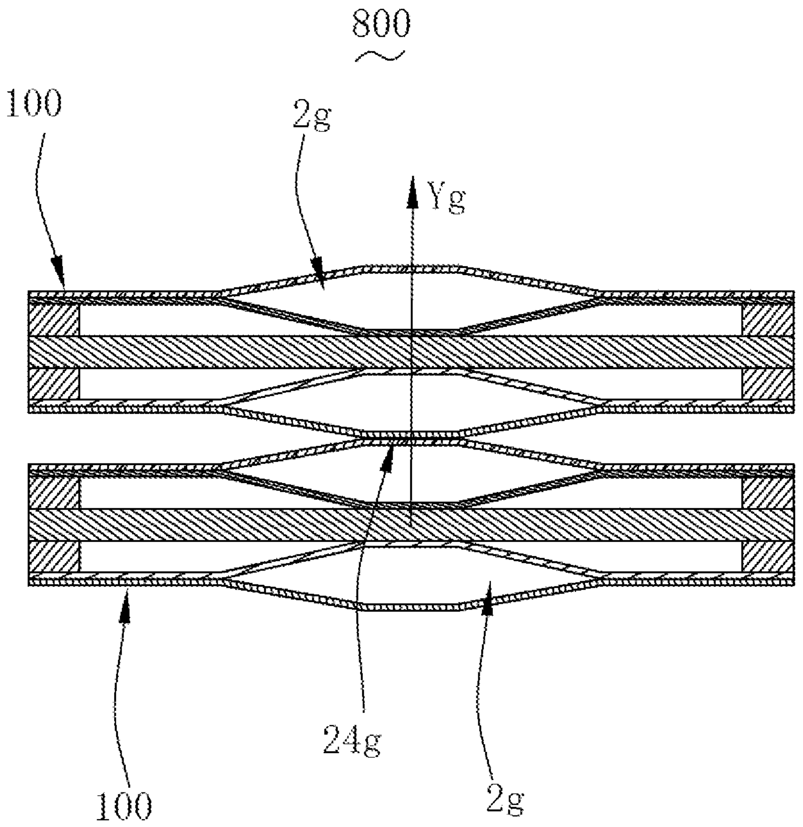
FIG. 17 is a schematic structural diagram of a piezoelectric vibrator assembly according to Embodiment 8 of the present disclosure.

Referring to FIG. 17, in Embodiment 8, the piezoelectric vibrator assembly 800 includes at least two piezoelectric vibrators 100. The two piezoelectric vibrators 100 are stacked and connected along the second direction Yg. The fourth sections 24*g* in adjacent amplifying units 2*g* of the two piezoelectric vibrators 100 are attached and fixed.

When the two piezoelectric vibrators 100 are superimposed, piezoelectric displacement can be amplified to the greatest extent, and an overall amplification factor is a product of amplification factors of the two.

When the two piezoelectric vibrators 100 are stacked, only middle parts of the amplifying units 2*g* are required to be welded or bonded.

Compared with the related art, according to the piezoelectric vibrator and the piezoelectric vibrator assembly of the present disclosure, a piezoelectric body is provided, and at least one of two opposite sides of the piezoelectric body is provided with an amplifying unit fixedly supported thereon. The piezoelectric body is made of a single-layer or multi-layer material with a piezoelectric effect. When the piezoelectric body is subjected to an external voltage, due to an inverse piezoelectric effect, the piezoelectric body contracts or expands along a first direction parallel to a plane of the piezoelectric body. Since the amplifying unit is a flat structure formed by an elastic reinforcing element and having a same shape as the piezoelectric body and the elastic reinforcing element is a metal sheet, the amplifying unit contracts or expands along the second direction simultaneously. The first direction and the second direction are perpendicular to each other. The structure alleviates the problem of small response displacement or requirement of a high stimulus voltage of the piezoelectric body, so that the piezoelectric vibrator and the piezoelectric vibrator assembly of the present disclosure have a small volume, fast response, an adjustable resonance frequency, a wide operating frequency, and high energy conversion efficiency.

The above are only embodiments of the present disclosure and not thus intended to limit the patent scope of the present disclosure. All equivalent structures or equivalent flow transformations made by virtue of contents of the specification and the drawings of the present disclosure or direct or indirect application of the contents to the other related technical fields shall fall within the patent protection scope of the present disclosure.

What is claimed is:

1. A piezoelectric vibrator comprising: a piezoelectric body; and an amplifying unit fixedly supported to at least one of two opposite sides of the piezoelectric body, wherein the piezoelectric body comprises a single-layer or multi-layer material with a piezoelectric effect, the amplifying unit is a flat structure formed by an elastic reinforcing element and having a same shape as the piezoelectric body, the elastic reinforcing element being a metal sheet, and when an external voltage is applied to the piezoelectric body, the piezoelectric body expands or contracts along a first direction parallel to a plane of the piezoelectric body, and simultaneously, the amplifying unit contracts or expands along a second direction, the first direction and the second direction being perpendicular to each other.

2. The piezoelectric vibrator according to claim 1, wherein the piezoelectric body comprises:

a plurality of stacked internal electrodes having different polarities;

a plurality of stacked piezoelectric layers surrounding peripheries of the plurality of internal electrodes and electrically connected to the plurality of internal electrodes; and a plurality of external electrodes surrounding peripheries of the plurality of piezoelectric layers and electrically connected to the plurality of piezoelectric layers, wherein the plurality of internal electrodes and the plurality of piezoelectric layers are stacked along the second direction, and each of the plurality of piezoelectric layers comprises a single piezoelectric ceramic layer or a plurality of piezoelectric ceramic layers.

3. The piezoelectric vibrator according to claim 1, wherein the piezoelectric body is in a shape of a strip or a square or a circle.

4. The piezoelectric vibrator according to claim 1, wherein the piezoelectric body comprises a plurality of piezoelectric ceramic layers polarized along the first direction.

5. The piezoelectric vibrator according to claim 1, wherein the amplifying unit comprises:

a first section fixed to the piezoelectric body;

two second sections respectively bending and obliquely extending from two opposite ends of the first section away from the piezoelectric body;

two third sections respectively bending and extending from the two second sections in a direction away from the first section and spaced apart from the piezoelectric body;

a fourth section spaced apart from and mirror-symmetrical with the first section;

two fifth sections respectively extending outward from the fourth section and respectively spaced apart from and mirror-symmetrical with the two second sections; and two sixth sections respectively attached to the two third sections and mirror-symmetrical with each other, wherein each of the two third sections is attached and fixed to a corresponding sixth section of the two sixth sections and constitutes a thickened end portion of the amplifying unit together with the corresponding sixth section, wherein the thickened end portion is supported on and fixed to the piezoelectric body, and wherein the two first sections, the two second sections, the fourth section, and the two fifth sections jointly constitute the flat structure.

6. The piezoelectric vibrator according to claim 5, wherein a length of the thickened end portion along the first direction is equal to half of a length of the flat structure along the first direction.

7. The piezoelectric vibrator according to claim 5, further comprising a fixed end block, wherein the thickened end portion is supported on and connected to the piezoelectric body through the fixed end block, and the fixed end block is electrically insulated from the piezoelectric body.

8. The piezoelectric vibrator according to claim 7, wherein the amplifying unit comprises two amplifying units respectively located on the two opposite sides of the piezoelectric body, and the fixed end block comprises at least two fixed end blocks, and wherein each of the two amplifying units is connected to the piezoelectric body through one of the at least two fixed end blocks.

9. The piezoelectric vibrator according to claim 5, wherein the first section is fixed to a center of the piezoelectric body, and the amplifying unit has a symmetrical structure centered on the first section, and wherein an amplification factor of the piezoelectric vibrator is a ratio of a displacement amount of the piezoelectric body along the first direction to a displacement amount of the amplifying unit along the second direction.

10. The piezoelectric vibrator according to claim 5, wherein the amplifying unit is in a shape of a rectangle or a square or a circle.

11. The piezoelectric vibrator according to claim 5, wherein the amplifying unit further comprises a fixed portion extending from the thickened end portion and fixed to an edge of the piezoelectric body, and the thickened end portion bends and obliquely extends from the flat structure to the edge of the piezoelectric body.

12. The piezoelectric vibrator according to claim 11, wherein the amplifying unit comprises at least one amplifying unit, one amplifying unit of the at least one amplifying unit is located on one side of the piezoelectric body, and the other side of the piezoelectric body is connected to another amplifying unit of the at least one amplifying unit or a feasible structure configured to buffer amplification.

13. The piezoelectric vibrator according to claim 5, wherein the amplifying unit further comprises a bending portion bending and obliquely extending from the thickened end portion to an edge of the piezoelectric body and a fixed portion fixed to the edge of the piezoelectric body.

14. The piezoelectric vibrator according to claim 13, wherein the amplifying unit comprises at least one amplifying unit, one amplifying unit of the at least one amplifying unit is located on one side of the piezoelectric body, and the other side of the piezoelectric body is connected to another amplifying unit of the at least one amplifying unit or a feasible structure configured to buffer amplification.

15. The piezoelectric vibrator according to claim 8, wherein the fixed end block comprises at least one fixed end block, each fixed end block is fixed to an outer side of the piezoelectric body along the first direction, and the thickened end portions corresponding to the two amplifying units are respectively fixed to two opposite ends of a fixed end block of the at least one fixed end block along the second direction; and wherein the piezoelectric vibrator further comprises a connecting section made of a same metal as the amplifying unit; wherein the connecting section is fixed to a side of the fixed end block away from the piezoelectric body along the first direction, and the third section of the amplifying unit is connected to the connecting section.

16. The piezoelectric vibrator according to claim 15, further comprising two buffer members, the two buffer members each being fixed to a side of the corresponding first section away from the piezoelectric body and arranged apart from the fourth section.

17. The piezoelectric vibrator according to claim 16, wherein the two buffer members are made of a polymer.

18. The piezoelectric vibrator according to claim 8, further comprising a connecting section made of a same metal as the amplifying unit, wherein the connecting section is fixed to an outer side of the piezoelectric body along the first direction, and the third sections corresponding to the two amplifying units are respectively connected to the connecting section.

19. The piezoelectric vibrator according to claim 18, further comprising two buffer members, the two buffer members each being fixed to a side of the corresponding first section away from the piezoelectric body and arranged apart from the fourth section.

20. The piezoelectric vibrator according to claim 19, wherein the two buffer members are made of a polymer.

21. The piezoelectric vibrator according to claim 18, wherein the sixth sections corresponding to the two amplifying units respectively extend away from the first section, and two opposite sides of the fixed end block along the second direction are connected extension parts of the two sixth sections.

22. The piezoelectric vibrator according to claim 21, further comprising two buffer members, the two buffer members each being fixed to a side of the corresponding first section away from the piezoelectric body and arranged apart from the fourth section.

23. The piezoelectric vibrator according to claim 22, wherein the two buffer members are made of a polymer.

24. The piezoelectric vibrator according to claim 5, wherein the amplifying unit comprises a first amplifying unit, a second amplifying unit, and a third amplifying unit, the first, second and third amplifying units being all located on a same side of the piezoelectric body and jointly forming a three-layer elastic element structure, wherein the first amplifying unit and the second amplifying unit are connected side by side, the third section of the first amplifying unit and the third section of the second amplifying unit are made of a same metal sheet, wherein the sixth section of the first amplifying unit and the sixth section of the second amplifying unit are made of a same metal sheet, wherein the third amplifying unit is arranged on a side of the first amplifying unit and the second amplifying unit away from the piezoelectric body, wherein the first section of the third amplifying unit, the sixth section of the first amplifying unit, and the sixth section of the second amplifying unit are all made of a same metal sheet, wherein the two second sections of the third amplifying unit are respectively the fifth sections extending from the connected sixth sections the first amplifying unit and the second amplifying unit, wherein the two third sections of the third amplifying unit are respectively the fourth section of the first amplifying unit and the fourth section of the second amplifying unit, and wherein the two sixth sections of the third amplifying unit are fixedly attached to the fourth section of the first amplifying unit and the fourth section of the second amplifying unit respectively.

25. The piezoelectric vibrator according to claim 24, wherein the amplifying unit comprises two amplifying units respectively located on the two opposite sides of the piezoelectric body.

26. A piezoelectric vibrator assembly comprising at least two piezoelectric vibrators according to claim 8, wherein the at least two piezoelectric vibrators are fixedly stacked along the second direction, and the fourth sections in adjacent amplifying units of the at least two piezoelectric vibrators are fitted and fixed to each other.

* * * * *